(12) United States Patent
Cretu et al.

(10) Patent No.: US 12,087,381 B2
(45) Date of Patent: Sep. 10, 2024

(54) SYSTEMS AND METHODS FOR DETECTING AND CONFIGURING LANES IN A CIRCUIT SYSTEM

(71) Applicant: Intel Corporation, Santa Clara, CA (US)

(72) Inventors: Marian Cretu, Munich (DE); Musaravakkam S. Krishnan, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 601 days.

(21) Appl. No.: 17/357,181

(22) Filed: Jun. 24, 2021

(65) Prior Publication Data

US 2021/0319841 A1  Oct. 14, 2021

(51) Int. Cl.
*G11C 29/16* (2006.01)
*G06F 1/04* (2006.01)
*G06F 1/08* (2006.01)
*G06F 13/00* (2006.01)
*G06F 13/42* (2006.01)
(Continued)

(52) U.S. Cl.
CPC .......... *G11C 29/16* (2013.01); *G06F 13/4213* (2013.01); *G11C 29/02* (2013.01); *G06F 1/04* (2013.01); *G06F 1/08* (2013.01); *G06F 11/1048* (2013.01); *G06F 13/00* (2013.01); *G06F 13/423* (2013.01); *G06F 13/4243* (2013.01); *G06F 13/4256* (2013.01); *G06F 2213/0024* (2013.01);
(Continued)

(58) Field of Classification Search
CPC ....... G11C 29/16; G11C 29/02; G11C 29/023; G11C 29/025; G11C 29/028; G06F 13/4213; G06F 13/4243; G06F 13/423; G06F 11/1048; G06F 1/08; G06F 2213/0024; G06F 13/4256; G06F 1/04; G06F 13/00
See application file for complete search history.

(56) References Cited

U.S. PATENT DOCUMENTS 5,495,594 A   2/1996  MacKenna et al.
7,281,070 B2  10/2007  Bomhoff et al.
(Continued)

OTHER PUBLICATIONS

Peterson (Fly-by Topology Routing for DDR3 and DDR4 Memory, Altium PCB Design Blog, resources.altium.com, Apr. 5, 2021) (Year: 2021).*

*Primary Examiner* — Manish S Shah
*Assistant Examiner* — Christian T Bryant
(74) *Attorney, Agent, or Firm* — InventIQ Legal LLP; Steven J. Cahill

(57) ABSTRACT

An electronic circuit system includes a main device that generates first and second strobe signals and a clock signal, a first peripheral device that uses the first strobe signal to generate a first output signal in a first lane in response to the clock signal, and a second peripheral device that uses the second strobe signal to generate a second output signal in a second lane in response to the clock signal. The main device determines if the first peripheral device is coupled to the main device through the first lane based on the first output signal. The main device determines if the second peripheral device is coupled to the main device through the second lane based on the second output signal. The main device also has the ability to detect if a peripheral device is faulty and to select a valid configuration of peripheral devices.

22 Claims, 3 Drawing Sheets

(51) Int. Cl.
*G11C 29/02* (2006.01)
*G06F 11/10* (2006.01)

(52) U.S. Cl.
CPC .......... *G11C 29/023* (2013.01); *G11C 29/025* (2013.01); *G11C 29/028* (2013.01)

(56) References Cited

U.S. PATENT DOCUMENTS

| | | | |
|---|---|---|---|
| 2004/0246767 A1* | 12/2004 | Vogt | G06F 13/4256 365/154 |
| 2013/0311717 A1* | 11/2013 | Kim | G11C 11/1675 365/158 |
| 2014/0035633 A1* | 2/2014 | Ichimiya | H04L 25/14 327/142 |
| 2016/0283429 A1* | 9/2016 | Wagh | G06F 13/4068 |
| 2018/0075898 A1* | 3/2018 | Prakash | G11C 29/023 |

* cited by examiner

SYSTEMS AND METHODS FOR DETECTING AND CONFIGURING LANES IN A CIRCUIT SYSTEM

FIELD OF THE DISCLOSURE

The present disclosure relates to electronic circuit systems, and more particularly, to systems and methods for detecting and configuring lanes in a circuit system.

BACKGROUND

In many electronic circuit systems, a main processing integrated circuit is coupled to memory integrated circuits that are either located on the same circuit board as the main processing integrated circuit or other circuit boards electrically connected to the given circuit board. The memory capacity of each of the memory integrated circuits in a circuit system typically needs to be determined in advance prior to operation of the circuit system. A different version of firmware is loaded into each circuit system having a different number of memory integrated circuits. A failure in any of the memory integrated circuits typically requires manual troubleshooting after the circuit system has been configured in order to isolate a failing memory integrated circuit prior to its replacement.

DETAILED DESCRIPTION

Figure 1:
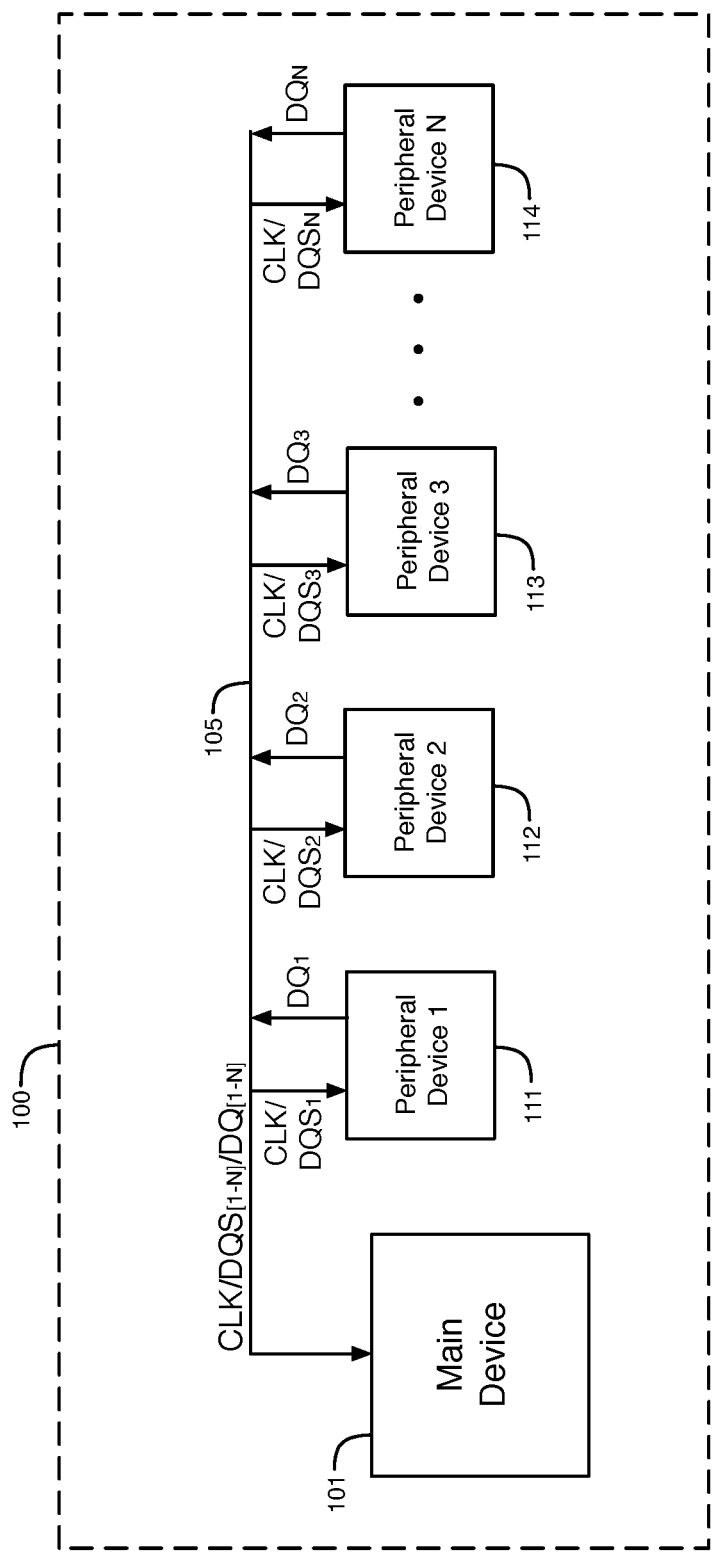
FIG. 1 illustrates a circuit system that includes a main device, a system bus, and peripheral devices, according to an embodiment.

In previously known circuit systems, the memory capacities of memory integrated circuits need to be determined prior to the operation of the circuit system. Therefore, the same circuit board design cannot be reused across multiple product configurations. Also, different circuit systems having different memory capacities need to be designed, brought up, maintained, and tracked separately, which may cause an enormous development effort and maintenance overhead. Often, memory integrated circuits need to be calibrated to guarantee proper system operation. However, the calibration does not succeed if there is a fault in the physical connection to one of the memory integrated circuits, which may cause the detection of the failure to be deferred to the later stages of the system initialization.

According to some embodiments disclosed herein, a circuit system can dynamically select a desired configuration prior to the operation of the circuit system by automatically detecting the number of lanes that are coupled between peripheral devices and a main device in the circuit system. The circuit system may create a mapping of populated peripheral devices that is used to select a final configuration of lanes for the circuit system based on user-specified options. The circuit system may also perform early detection of failures in one or more of the peripheral devices and generate reporting and diagnosis of faults in the peripheral devices. The failures may, for example, be caused by a systemic board defect or a device-internal defect introduced during manufacturing, assembly, or subsequently in the field. The circuit system may alert a user regarding a potential failure of one of the peripheral devices and provide information on which peripheral device or lane is failing so that the problem can be addressed and/or resolved. Also, if a peripheral device having a fault is detected, and the circuit system can function without the faulty peripheral device, the faulted peripheral device can be automatically decoupled from the circuit system, and the circuit system can be reconfigured to function with the remaining peripheral devices. If the circuit system has a spare peripheral device, the spare peripheral device may replace the faulty peripheral device.

According to some embodiments, a single system-level design for a circuit system can be deployed and reused for multiple product configurations with peripheral devices having different storage capacities. As a result, product development and validation costs may be significantly reduced. If N is the maximum number of peripheral devices that a circuit system can support, the circuit system can automatically detect and configure any number between 1 and N of the peripheral devices that are populated and coupled in the circuit system.

As an example, the peripheral devices may include memory integrated circuits, and the different product configurations may include memory integrated circuits that have different widths and/or memory capacities. In embodiments in which the peripheral devices are memory integrated circuits, the circuit system can dynamically reconfigure the width of the memory integrated circuits in the field, and continue system operation without any hardware modification. The circuit system may also contain firmware that can be easily updated either prior to the release of the circuit system or in the field to enable a different configuration of the peripheral devices.

In some embodiments, the circuit system may have the ability to precisely detect a fault on a peripheral device (such as a memory integrated circuit) for replacement, and immediately upon such detection, reconfigure the system to work around the defective device. The circuit system may also have the ability to decouple a faulted peripheral device and reconfigure a system interface to be narrower if the circuit system can accommodate a narrower system interface. The circuit system may also be able to automatically replace a faulty peripheral device with a spare peripheral device if the circuit system has one or more spare peripheral devices.

According to some embodiments, techniques are disclosed herein that can be used to detect the number of lanes coupled to peripheral devices in a circuit system. Each of the lanes may be, for example, a data channel. In some embodiments, a technique described as "training" is used as an example to refer to a procedure that ensures the most reliable operation of a peripheral device. In embodiments where the peripheral devices are memory devices such as SDRAMs, the training procedure calibrates the strobe signal to a given memory device to achieve the best alignment between the strobe signal and the clock signal to the given memory device. Such a training procedure can be combined with other training techniques to minimize the system initialization time. In these embodiments, training values are collected from the peripheral devices during a training procedure to determine which of the peripheral devices are coupled to the main device through the lanes. These techniques can also compensate for eventual jitter on a system clock signal by selecting the most frequently measured training values collected from multiple iterations of signals transmitted between the peripheral devices and the main device.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

In the following description, numerous details are discussed to provide a more thorough explanation of embodiments of the present disclosure. It will be apparent, however, to one skilled in the art, that the embodiments of the present disclosure may be practiced without these specific details. In other instances, well-known structures and devices are shown in block diagram form, rather than in detail, in order to avoid obscuring embodiments of the present disclosure.

Figure (FIG.) 1 illustrates a circuit system 100 that includes a main device 101, a system bus 105, and an N number of peripheral devices, according to an embodiment. Four peripheral devices 111-114 are shown in FIG. 1 merely as an example. The main device 101 and the peripheral devices 111-114 are electronic devices, such as electronic integrated circuits. Each of the peripheral devices 111-114 may, for example, be a separate integrated circuit module, package or die (referred to hereafter as "component"). Main device 101 may, for example, be one or more integrated circuit (IC) dies that are separate from each of the peripheral components 111-114. Main device 101 may be any type of electronic device, such as a programmable logic IC (e.g., a field programmable gate array), a microprocessor, a graphics processing unit, an application specific integrated circuit (ASIC), or a structured ASIC.

The peripheral devices 111-114 may be any types of electronic peripheral devices, such as, for example, memory integrated circuits. The peripheral devices 111-114 may, for example, include any type of memory that has the ability to respond to a strobe signal with a response on its output, such as (but not limited to) random access memory (RAM), dynamic RAM (DRAM), static RAM (SRAM), or synchronous DRAM (i.e., SDRAM). Each of the devices 101 and 111-114 may, for example, be coupled to a printed circuit board in circuit system 100.

According to some embodiments, the main device 101 generates a clock signal CLK and an N number of strobe signals $DQS_{[1-N]}$ that are transmitted through the system bus 105 to the peripheral devices, including peripheral devices 111-114. The clock signal CLK is a global clock signal that is transmitted from the main device 101 through system bus 105 to each of the peripheral devices, including peripheral devices 111-114. Each of the strobe signals $DQS_{[1-N]}$ is transmitted from the main device 101 through the system bus 105 to one of the peripheral devices. For example, strobe signals $DQS_1$, $DQS_2$, $DQS_3$, and $DQS_N$ are transmitted from the main device 101 through the system bus 105 to the peripheral devices 111, 112, 113, and 114, respectively. Each of the peripheral devices uses the received strobe signal DQS to sample the clock signal CLK to generate an output response signal DQ. For example, peripheral devices 111, 112, 113, and 114 generate output signals $DQ_1$, $DQ_2$, $DQ_3$, and $DQ_N$ by sampling clock signal CLK using strobe signals $DQS_1$, $DQS_2$, $DQS_3$, and $DQS_N$, respectively. The output signals $DQ_{[1-N]}$ may, for example, be data signals generated by memory peripheral devices using the strobe signals $DQS_{[1-N]}$. The output signals $DQ_{[1-N]}$ are transmitted from the peripheral devices through independent lanes of the system bus 105 to the main device 101. The system bus 105 has a width determined by the number of peripheral devices coupled to the main device 101 in the circuit system, independent of any other bus in the circuit system.

The main device 101 can use the clock signal CLK, the strobe signals $DQS_{[1-N]}$, and the output signals $DQ_{[1-N]}$ to detect the number of lanes coupled to the peripheral devices in circuit system 100, as discussed in further detail below. Each of the lanes in the circuit system 100 may, for example, be a bi-directional (or unidirectional) data channel that is used to transmit data between the main device 101 and one of the peripheral devices when the lane is coupled to the main device 101 and to the corresponding one of the peripheral devices.

According to a specific embodiment that is not intended to be limiting, the peripheral devices, including peripheral devices 111-114, are memory devices such as synchronous dynamic random access memory (SDRAM) devices, and the main device 101 uses a write leveling feature of SDRAM devices to detect the number of lanes that are coupled to active peripheral devices in circuit system 100. Each of the SDRAM devices may have, for example, 2 or more lanes (e.g., data channels) coupled to the main device 101. The main device 101 executes the write leveling algorithm using the clock signal CLK and the strobe signals DQS to the maximum number of SDRAM peripheral devices that the circuit system 100 can support. Because only the active SDRAM peripheral devices in circuit system 100 generate valid responses (i.e., on signals DQ) to the strobe signals DQS, the main device 101 infers the probable number of active lanes in the circuit system 100 based on the response signals DQ received from the SDRAM peripheral devices. SDRAM devices are discussed herein merely as an example. In other embodiments, the techniques disclosed herein can be implemented with any types of peripheral devices that can individually respond to a broadcast signal from the main device.

In some embodiments, the main device 101 may repeat the write leveling algorithm in training iterations in a loop and may collect the calibrated values based on DQ responses that are received from the SDRAM devices. The values of the DQ signals are checked to make sure that their variance does not exceed an expected, predefined range. The values for which the circuit system 100 is calibrated most frequently are selected as the best values. If gaps are detected during the training iterations of the loop, the write leveling algorithm may report an error and provide information on which lanes are failing. If the training iterations complete successfully, the write leveling algorithm stores the best calibrated values and proceeds to normal system operation with the number of lanes detected. If circuit system 100 can support N peripheral devices, but is required to function with N-K peripheral devices (e.g., for power saving purposes), the main device 101 can reconfigure the interface to the peripheral devices by requesting to accommodate a narrower interface. Further details of these embodiments are disclosed herein with respect to FIGS. 2A-2B.

Figure 2A:
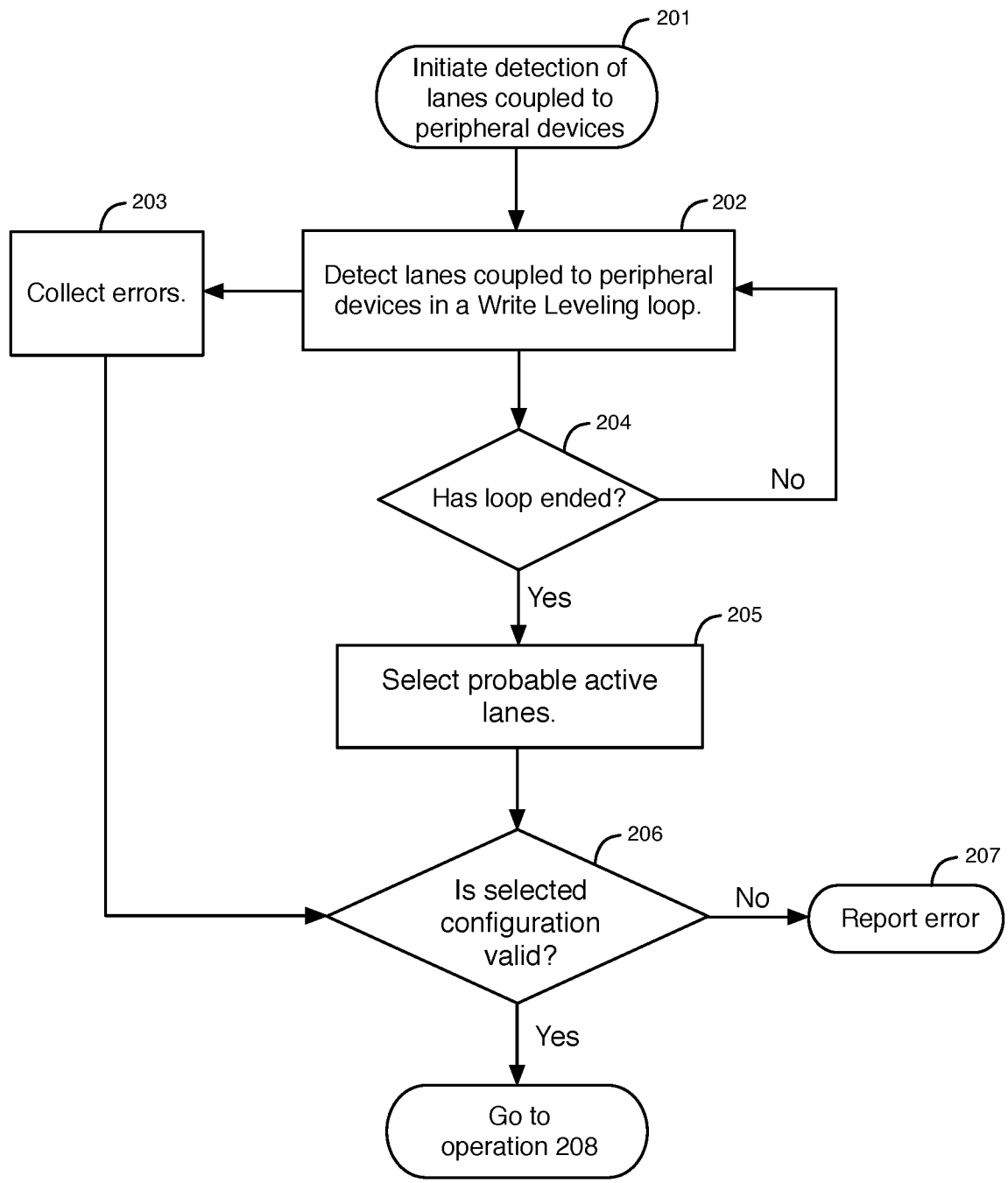
FIGS. 2A-2B are a flow chart that illustrates examples of operations that may be performed by the circuit system of FIG. 1 to detect the number of lanes coupled to the peripheral devices in the circuit system, according to an embodiment.
Figure 2B:
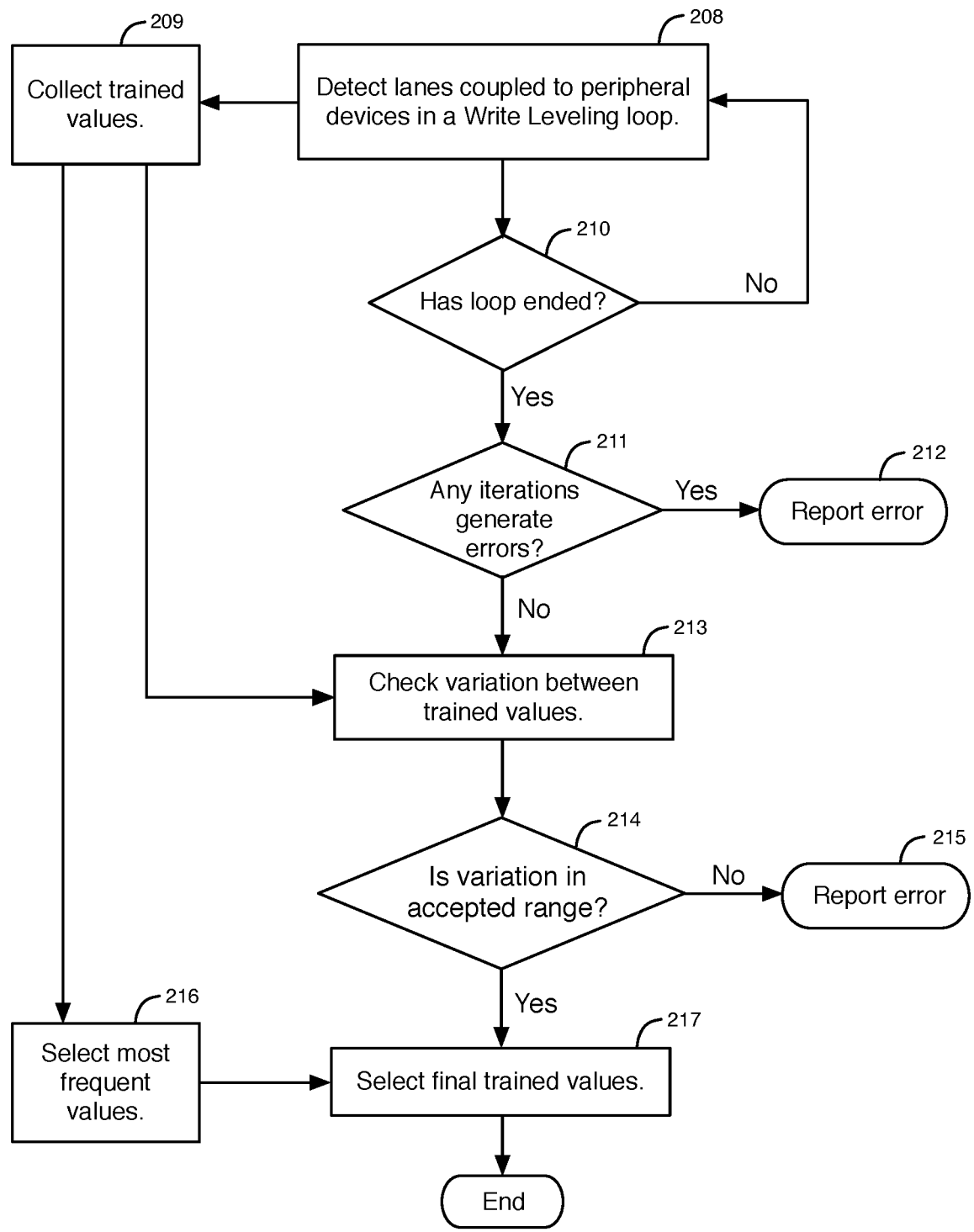

FIGS. 2A-2B are a flow chart that illustrates examples of operations that may be performed by circuit system 100 of FIG. 1 to detect the number of lanes coupled to the peripheral devices in circuit system 100, according to an embodiment. The operations of FIGS. 2A-2B may, for example, be performed by firmware operating in circuit system 100 (e.g., in main device 101) or in another computing system. In operation 201, main device 101 initiates the process of detecting the lanes that are coupled to the peripheral devices and that are coupled to main device 101 in circuit system 100. In operation 202 shown in FIG. 2A, circuit system 100 detects the lanes that are coupled to the peripheral devices in circuit system 100 and to main device 101 through iterations of a loop.

According to the exemplary embodiment disclosed herein with respect to FIG. 1, the main device 101 may detect the number of lanes coupled to peripheral devices in circuit system 100 in a write leveling loop in operation 202 by using a clock signal CLK and strobe signals DQS that are transmitted to the peripheral devices. The strobe signals DQS are active signals generated by the main device 101. The main device 101 provides a valid strobe signal DQS to each of the peripheral devices. During the write leveling procedure, each of the peripheral devices uses its DQS strobe signal to sample the clock signal CLK and generate a response signal DQ. The DQ response signal carries the value sampled on the clock signal CLK by the DQS signal. The response signals DQ generated by the peripheral devices are transmitted to the main device 101. In operation 202, main device 101 may determine and select the best alignment between the strobe signal DQS and the clock signal CLK for each peripheral device in the circuit system 100 by adjusting the delay of the strobe signal DQS relative to the clock signal CLK (e.g., in fractional increments of the period of clock signal CLK) based on the response signal DQ from the corresponding peripheral device.

In operation 203, circuit system 100 collects reported errors in the DQ signals that are received for each lane. In order to execute the write leveling loop in operation 202 and to collect any errors in the DQ signals in operation 203, the circuit system 100 may perform two or more iterations of operation 202. In each iteration of the loop in operation 202, the peripheral devices use the strobe signals DQS to sample the clock signal CLK to generate additional values on signals DQ, and main device 101 determines the best alignment between the strobe signal DQS and the clock signal CLK for each peripheral device.

For embodiments in which the peripheral devices are memory devices, such as SDRAM devices, firmware in circuit system 100 may execute a write leveling algorithm an M number of iterations in a loop (where M is a user configurable number) in operation 202 to account for the maximum number of lanes that circuit system 100 can support. Circuit system 100 may then collect reported errors for each lane in operation 203. If one of the peripheral devices is not populated in circuit system 100, has a fault, or is not coupled to main device 101 through a lane, the DQ wire in bus 105 that provides the response signal DQ from that peripheral device is in a high-impedance state. For the write leveling algorithm to pass predefined criteria, each of the responses in signals DQ must contain a predefined pattern. This predefined pattern, in the embodiments that use write leveling, represents the value of the clock signal CLK sampled with signal DQS by the SDRAM device at different moments in time. If a given SDRAM device is connected correctly, the response in signal DQ contains that predefined pattern. If the SDRAM device is not connected or has a fault (e.g., either at its connections to system 100 or internally), the response received on signal DQ is very unlikely to contain that predefined pattern, although it is not impossible, because the signal line DQ is in a high-impedance state when a peripheral device is not connected. In these embodiments, the main device 101 determines in operation 202 if the signals DQ from the SDRAM peripheral devices contain the predefined patterns.

In operation 204, circuit system 100 decides whether to continue to execute the loop in operation 202 based on the number of iterations performed in operation 202. In operation 205, the main device 101 selects the lanes that are most likely to be active in circuit system 100. An active lane is a lane that is electrically coupled between one of the peripheral devices and the main device 101. After the most likely active lanes are identified in operation 205, a verification check then is performed to determine if the number of lanes that are most likely to be active is within an expected range of accepted values for the application of circuit system 100. Circuit system 100 may then be configured to function with the number of active lanes selected after the verification check filters out any inactive lanes. Inactive lanes are not coupled between main device 101 and a peripheral device. Any inactive lanes may be removed from the interface to the lanes (e.g., at main device 101) in operation 205. As an example, the main device 101 may use a lookup-table in operation 205 to select a valid option for the active lanes, which is the largest number in the lookup-table that is equal to or smaller than the passing lanes detected in operation 202. The verification check of operation 205 is used to filter out sporadic false results. For example, if a 6-lane system is expected, but 7 lanes were reported as passing in operation 202, then circuit system 100 selects 6 lanes as active lanes in operation 205. The circuit system 100 may then be configured to operate with the number of lanes selected in operation 205.

In operation 206, circuit system 100 determines, based on reported responses on the DQ signals that were collected in operation 203, if the probable active lanes selected in operation 205 are a valid configuration (i.e., within predefined ranges for the application for circuit system 100). If the selected configuration is not a valid one in operation 206, then circuit system 100 reports an error in operation 207. If the selected configuration is a valid one, circuit system 100 may be configured to function with the selected configuration, and then circuit system 100 proceeds to operation 208.

In operation 208 shown in FIG. 2B, the circuit system 100 detects the lanes coupled to the peripheral devices by executing a K number of iterations of a write leveling loop. In operation 208, the write leveling operation is applied on the configuration selected in operation 206. As discussed above with respect to operation 202, circuit system 100 may detect the lanes coupled to the peripheral devices by sampling the clock signal CLK using a unique strobe signal DQS at each of the peripheral devices to generate a unique output response signal DQ from each of the peripheral devices. During operation 208, the main device 101 determines and selects the best alignment between the strobe signal DQS and the clock signal CLK for each peripheral device in the circuit system 100 by adjusting the delay of the strobe signal DQS relative to the clock signal CLK (e.g., in fractional increments of the period of clock signal CLK) based on the output response signal DQ from the corresponding peripheral device. For embodiments in which the peripheral devices are memory devices, such as SDRAM devices, the circuit system 100 may execute write leveling a K number of iterations in a loop (where K is user configurable) in operation 208.

In operation 209, circuit system 100 collects the trained values generated during the K iterations of the loop (e.g., at main device 101) in operation 208. The purpose of operations 208-209 is to ensure that the circuit system consistently passes predefined criteria across multiple iterations of the loop. In operation 216, the circuit system 100 selects the trained values that occur most frequently among the trained values collected in operation 209. Operation 216 helps to filter out intermittent and/or random errors, such as those errors caused by jitter (variation from true periodicity) in clock signal CLK.

In operation 210, circuit system 100 decides whether to continue to execute the loop in operation 208 based on the number of iterations performed in operation 208. After the completion of the loop performed in operation 208, circuit system 100 determines in operation 211 if any of the iterations of the loop generated errors in the DQ signals. If the circuit system 100 determines in operation 211 that at least one of the iterations of the loop generated an error in the DQ signals, circuit system 100 reports an error in operation 212. If the circuit system 100 determines in operation 211 that all of the iterations of the loop in operation 208 passed without errors in the DQ signals, then circuit system 100 proceeds to operation 213.

In operations 213-214, circuit system 100 performs an extra check on all of the trained values that were collected in operation 209 to determine if the variation between the trained values is within an accepted range. The accepted range may be, for example, a user-specified range. The values of this user-specified range can be selected based on the mission criticality of the circuit system. For example, a very stringent application of the circuit system 100 may require the variation between the trained values to be +/−0 values, but a less critical application may allow the variation between the trained values to be +/−2 values. If the variation between the trained values is determined to be outside of the accepted range in operation 214, the circuit system 100 reports an error at operation 215. If the variation between the trained values is determined to be within the accepted range in operation 214, the circuit system 100 proceeds to operation 217. In operation 217, the final trained values are then selected to be the trained values that were selected in operation 216 as the values that occurred most frequently among the trained values collected in operation 209.

The circuit system 100 can then reconfigure a wide interface to the peripheral devices to a narrower interface by powering down the number of lanes and peripheral devices that were determined to be inactive in the operations of FIGS. 2A-2B. In circuit systems where power saving is required, powering down inactive lanes and peripheral devices can help to achieve power saving goals. As an example, in a video application, less DRAM peripheral devices may be needed if the refresh rate of the DRAM devices is reduced. In response to a request from a supervising system, the circuit system 100 processes the request and reconfigures the interface to the DRAM devices to a desired width.

The circuit system 100 can determine if a variation of values indicated by the DQ response signals are within predefined ranges to screen units with high jitter in the clock signal CLK. The circuit system 100 can also detect the range of attributes of the peripheral devices based on the values of the DQ response signals. For peripheral devices such as DRAMs, examples of the attributes are termination resistance values and voltage reference values. The detection of attributes can be used to determine if a given peripheral device needs to be replaced to improve the reliability of the circuit system.

During operation, executable software, such as software that performs the operations of FIGS. 2A-2B, may run on one or more processors, programmable logic ICs, or other devices in circuit system 100 (e.g., in main device 101). Databases and memory may be used to store data for the operations of FIGS. 2A-2B. In general, software and data may be stored in non-transitory computer readable storage media (e.g., tangible computer readable storage media). The software code may sometimes be referred to as software, data, firmware, executable instructions, instructions, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s). Software stored on the non-transitory computer readable storage media may be executed in circuit system 100. When the software of circuit system 100 is installed, the storage of circuit system 100 has instructions and data that cause the devices in circuit system 100 to execute various methods (processes). When performing these processes, the devices are configured to implement the functions of circuit system 100 (e.g., as disclosed herein with respect to FIGS. 1 and 2A-2B).

In some embodiments, circuit system 100 may have one or more spare peripheral devices that can replace any of the peripheral devices that are identified as faulty during the operations of FIGS. 2A-2B. If circuit system 100 has a spare peripheral device, and the operations of FIGS. 2A-2B identify a faulty device, circuit system 100 can identify the entire existing interface to the peripheral devices, detect which peripheral device is faulty, and based on the required interface width, reconfigure the interface to the existing peripheral devices to include the spare peripheral device. In order to implement this feature, the interface to the peripheral devices must support power-down on any lane.

The techniques disclosed herein can be implemented in a circuit system that supports any number of lanes and any number of peripheral devices. The write leveling algorithm can also be used with any number of peripheral devices and lanes. As a specific example that is not intended to be limiting, circuit system 100 may be implemented with 12 lanes (e.g., bytes) corresponding to 6 physical peripheral SDRAM devices with each peripheral SDRAM device supporting 2 lanes. In this example, the main device 101 can operate either using all 12 lanes and 6 SDRAM devices for maximum performance or using half of the lanes (i.e., 6 lanes) and 3 SDRAM devices for lower cost and lower power consumption.

Exemplary data is provided in Tables 1-7 below for an exemplary implementation of circuit system 100. In this exemplary implementation, circuit system 100 has 6 lanes and 3 SDRAM peripheral devices that are populated and physically coupled to main device 101. The exemplary data in Table 1 was generated during iterations of the operations of FIG. 2A. In this exemplary implementation of circuit system 100, main device 101 performed a write leveling algorithm in 10 iterations in operation 202 to generate the data in Table 1. The results of the ten iterations for each of the lanes are identified as iterations I0-I9 in the rows of Table 1. In Table 1, the 12 lanes supported by circuit system 100 are numbered 0-11. The trained values for each of the lanes 0-11 are shown in a corresponding one of the columns of Table 1.

TABLE 1

| Lane # | 11 | 10 | 9 | 8 | 7 | 6 | 5 | 4 | 3 | 2 | 1 | 0 |
|---|---|---|---|---|---|---|---|---|---|---|---|---|
| I0 | 0 | 1 | 1 | 1 | 1 | 1 | 0 | 0 | 0 | 0 | 0 | 0 |
| I1 | 1 | 1 | 1 | 1 | 1 | 1 | 0 | 0 | 0 | 0 | 0 | 0 |
| I2 | 1 | 0 | 1 | 1 | 1 | 1 | 0 | 0 | 0 | 0 | 0 | 0 |
| I3 | 0 | 1 | 1 | 1 | 1 | 1 | 0 | 0 | 0 | 0 | 0 | 0 |
| I4 | 1 | 1 | 1 | 1 | 1 | 1 | 0 | 0 | 0 | 0 | 0 | 0 |
| I5 | 1 | 1 | 1 | 1 | 1 | 1 | 0 | 0 | 0 | 0 | 0 | 0 |
| I6 | 0 | 1 | 1 | 1 | 1 | 1 | 0 | 0 | 0 | 0 | 0 | 0 |
| I7 | 0 | 0 | 1 | 1 | 1 | 1 | 0 | 0 | 0 | 0 | 0 | 0 |
| I8 | 1 | 1 | 1 | 1 | 1 | 1 | 0 | 0 | 0 | 0 | 0 | 0 |
| I9 | 1 | 1 | 1 | 1 | 1 | 1 | 0 | 0 | 0 | 0 | 0 | 0 |

In Table 1, 0 represents a passing result, and 1 represents an error result from the write leveling algorithm in operation 202. As shown in Table 1, lanes 0-5 reported passing results with no errors in iterations I0-I9, lanes 6-9 reported results with errors in iterations I0-I9, and lanes 10 and 11 sometimes reported results with errors in iterations I0-I9. With the results of Table 1 and data indicating that circuit system 100 can support 6 or 12 SDRAM lanes, the firmware in circuit system 100 selects the first 6 lanes as the probable active lanes in operation 205, because only the first 6 lanes 0-5 generated no errors in each of the 10 iterations I0-I9. Circuit system 100 is then configured for 6 lanes by keeping lanes 0-5 powered up and powering down lanes 6-11. The corresponding input and output drivers and all related logic circuitry in main device 101 that drive lanes 6-11 are put into a safe state that is consistent with standard power optimization guidelines.

In the exemplary implementation of circuit system 100 disclosed above with respect to Table 1, main device 101 performed a write leveling algorithm in 64 iterations in operation 208 and captured the trained values shown below in Tables 2-7 in operation 209 for each of the 6 active lanes 0-5. The exemplary trained values shown in Tables 2, 3, 4, 5, 6, and 7 below correspond to lanes 0, 1, 2, 3, 4, and 5, respectively, where the values are represented using hexadecimal notation. The trained values in Tables 2-7 have 16 possible values that range from 00 to 0f with a wraparound from 00 to 0f and then back to 00. The 16 possible trained values are 00, 01, 02, 03, 04, 05, 06, 07, 08, 09, 0a, 0b, 0c, 0d, 0e, and 0f. After 0f, the trained values wrap around back to 00.

TABLE 2

| | | | | | | | | | | | | | | | |
|---|---|---|---|---|---|---|---|---|---|---|---|---|---|---|---|
| 02 | 02 | 02 | 02 | 02 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 03 | 03 |

TABLE 3

| | | | | | | | | | | | | | | | |
|---|---|---|---|---|---|---|---|---|---|---|---|---|---|---|---|
| 02 | 02 | 02 | 02 | 02 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 02 | 02 |

TABLE 4

| | | | | | | | | | | | | | | | |
|---|---|---|---|---|---|---|---|---|---|---|---|---|---|---|---|
| 01 | 01 | 01 | 01 | 01 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 02 | 02 |
| 02 | 02 | 02 | 02 | 02 | 02 | 02 | 02 | 02 | 02 | 02 | 02 | 02 | 02 | 02 | 02 |

TABLE 5

| | | | | | | | | | | | | | | | |
|---|---|---|---|---|---|---|---|---|---|---|---|---|---|---|---|
| 01 | 01 | 01 | 01 | 01 | 01 | 01 | 01 | 01 | 01 | 01 | 01 | 01 | 01 | 01 | 01 |
| 01 | 01 | 01 | 01 | 01 | 01 | 01 | 01 | 01 | 01 | 01 | 01 | 01 | 01 | 01 | 01 |
| 01 | 01 | 01 | 01 | 01 | 01 | 01 | 01 | 01 | 01 | 01 | 01 | 01 | 01 | 01 | 01 |
| 01 | 01 | 01 | 01 | 01 | 01 | 01 | 01 | 01 | 01 | 01 | 01 | 01 | 01 | 02 | 02 |

TABLE 6

| | | | | | | | | | | | | | | | |
|---|---|---|---|---|---|---|---|---|---|---|---|---|---|---|---|
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |

TABLE 7

| | | | | | | | | | | | | | | | |
|---|---|---|---|---|---|---|---|---|---|---|---|---|---|---|---|
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 0f | 0f | 0f | 0f | 0f |

The trained values for some of the lanes 0-5 varied from one iteration to another in this exemplary implementation, as shown by the underlined values in Tables 2, 4, 5, and 7. In operation 216, a filter is applied to the results shown in Tables 2-7 to remove corner case values and to select the most frequently occurring trained values in each of the active lanes 0-5. The most frequently occurring trained values that are selected in operation 216 from each of the lanes are {0, 0, 0, 0, 0, 0, 0, 0, 1, 2, 2, 2}, where all 12 lanes are listed in the order of lanes 11, 10, 9, 8, 7, 6, 5, 4, 3, 2, 1, 0. The values for the active lanes are underlined, and the unused lanes 6 to 11 have values of 0.

In operations 213-214, the variation between the trained values selected in operation 209 is checked. In the exemplary implementation of the circuit system disclosed herein with respect to Tables 1-7, the permitted variation between the trained values is +/−1. Therefore, the trained values shown in Tables 2-7 are determined to be within the accepted range in operation 214, because the variation between the trained values does not exceed +/−1. Because an error was not detected in the trained values in operation 214, the most frequent trained values from operation 216 are stored in registers to be used as the final values in operation 217. In the selected configuration of the circuit system, 6 lanes are active and coupled to the main device 101. The procedure of FIGS. 2A-2B completes the auto-configuration of the circuit system 100, so that the circuit system can be enabled to proceed to normal operation.

Additional exemplary data is also provided in Table 8 below for another exemplary implementation of circuit system 100. In this exemplary implementation, circuit system 100 can support either 12 lanes with (6 SDRAM) peripheral devices or 6 lanes with (3 SDRAM) peripheral devices, 3 SDRAM peripheral devices are populated in circuit system 100, one of the lanes (lane 1) is decoupled from main device 101 to model a fault, and the other 5 lanes are coupled to main device 101 and the SDRAM devices. In this exemplary implementation of circuit system 100, main device 101 performed a write leveling algorithm in 10 iterations in operation 202 to generate the data in Table 8. The results of the ten iterations for the lanes are identified as iterations I0-I9 in the rows of Table 8. In Table 8, the 12 lanes supported by circuit system 100 are numbered (#) 0-11. The trained values for each of the lanes 0-11 are shown in one of the columns of Table 8.

TABLE 8

| Lane # | 11 | 10 | 9 | 8 | 7 | 6 | 5 | 4 | 3 | 2 | 1 | 0 |
|---|---|---|---|---|---|---|---|---|---|---|---|---|
| I0 | 0 | 1 | 1 | 1 | 1 | 1 | 0 | 0 | 0 | 0 | 1 | 0 |
| I1 | 1 | 1 | 1 | 1 | 1 | 1 | 0 | 0 | 0 | 0 | 1 | 0 |
| I2 | 1 | 0 | 1 | 1 | 1 | 1 | 0 | 0 | 0 | 0 | 1 | 0 |
| I3 | 0 | 1 | 1 | 1 | 1 | 1 | 0 | 0 | 0 | 0 | 1 | 0 |
| I4 | 1 | 1 | 1 | 1 | 1 | 1 | 0 | 0 | 0 | 0 | 1 | 0 |
| I5 | 1 | 1 | 1 | 1 | 1 | 1 | 0 | 0 | 0 | 0 | 1 | 0 |
| I6 | 0 | 1 | 1 | 1 | 1 | 1 | 0 | 0 | 0 | 0 | 1 | 0 |
| I7 | 0 | 0 | 1 | 1 | 1 | 1 | 0 | 0 | 0 | 0 | 1 | 0 |
| I8 | 1 | 1 | 1 | 1 | 1 | 1 | 0 | 0 | 0 | 0 | 1 | 0 |
| I9 | 1 | 1 | 1 | 1 | 1 | 1 | 0 | 0 | 0 | 0 | 1 | 0 |

In Table 8, 0 represents a passing result, and 1 represents an error result from the write leveling algorithm in operation 202. As shown in Table 8, lanes 0 and 2-5 reported passing results with no errors in iterations I0-I9, lanes 1 and 6-9 reported results with errors in iterations I0-I9, and lanes 10 and 11 sometimes reported results with errors in iterations I0-I9. Because only lanes 0 and 2-5 generated no errors in each of the 10 iterations as shown in Table 8, and circuit system 100 only supports 12 or 6 lanes in the exemplary implementation used to generate the data in Table 8, the write leveling algorithm reported an error message for each of lanes 1 and 6-11 to report that these lanes are faulty. Because lanes 6-11 are unpopulated in this implementation of circuit system 100, a user can infer from these error messages that lane 1 has a fault.

The following examples pertain to further embodiments. Example 1 is an electronic circuit system comprising: a main device that generates first and second strobe signals and a clock signal; a first peripheral device that uses the first strobe signal with the clock signal to generate a first output signal in a first lane; and a second peripheral device that uses the second strobe signal with the clock signal to generate a second output signal in a second lane, wherein the main device determines if the first peripheral device is coupled to the main device through the first lane based on the first output signal, and wherein the main device determines if the second peripheral device is coupled to the main device through the second lane based on the second output signal.

In Example 2, the electronic circuit system of Example 1 may optionally further comprise: a third peripheral device that uses a third strobe signal with the clock signal to generate a third output signal in a third lane, wherein the main device generates the third strobe signal, and wherein the main device determines if the third peripheral device is coupled to the main device through the third lane based on the third output signal.

In Example 3, the electronic circuit system of any one of Examples 1-2 may optionally further include, wherein the first and second peripheral devices are memory integrated circuits, wherein the main device determines if the first lane has a faulty connection between the first peripheral device and the main device based on the first output signal containing a first predefined pattern according to a write leveling algorithm, and wherein the main device determines if the second lane has a faulty connection between the second peripheral device and the main device based on the second output signal containing a second predefined pattern according to the write leveling algorithm.

In Example 4, the electronic circuit system of any one of Examples 1-3 may optionally further include, wherein the main device adjusts a delay of the first strobe signal relative to the clock signal based on the first output signal to generate a first adjusted strobe signal, and wherein the main device adjusts a delay of the second strobe signal relative to the clock signal based on the second output signal to generate a second adjusted strobe signal.

In Example 5, the electronic circuit system of Example 4 may optionally further include, wherein the first peripheral device uses the first adjusted strobe signal with the clock signal to generate a third output signal in the first lane, and wherein the second peripheral device uses the second adjusted strobe signal with the clock signal to generate a fourth output signal in the second lane.

In Example 6, the electronic circuit system of Example 5 may optionally further include, wherein the main device determines if the first peripheral device is coupled to the main device through the first lane without a fault based on the first and third output signals, and wherein the main device determines if the second peripheral device is coupled to the main device through the second lane without a fault based on the second and fourth output signals.

In Example 7, the electronic circuit system of Example 5 may optionally further include, wherein the main device determines if a variation of values indicated by the first and third output signals is within a predefined range and if a variation of values indicated by the second and fourth output signals is within the predefined range.

In Example 8, the electronic circuit system of any one of Examples 1-7 may optionally further include, wherein the main device adjusts a delay of the first strobe signal to the first peripheral device relative to the clock signal to align an edge of the first strobe signal with an edge of the clock signal, and wherein the main device adjusts a delay of the second strobe signal to the second peripheral device relative to the clock signal to align an edge of the second strobe signal to an edge of the clock signal.

In Example 9, the electronic circuit system of any one of Examples 1-8 may optionally further include, wherein the main device selects a value that occurs most frequently from the first peripheral device in the first lane as a final trained value for the first peripheral device, wherein the main device selects a value that occurs most frequently from the second peripheral device in the second lane as a final trained value for the second peripheral device, and wherein the main device uses the final trained values for the first and second peripheral devices to adjust the first and second strobe signal, respectively.

In Example 10, the electronic circuit system of any one of Examples 1-9 may optionally further include, wherein the main device collects errors in the first and second output signals and determines if the errors in the first and second output signals have values that are within predefined ranges.

Example 11 is a method for detecting lanes coupled to peripheral devices in an electronic circuit system, the method comprising: generating first and second strobe signals and a clock signal from a main device; using the first strobe signal at a first peripheral device to sample the clock signal to generate a first output signal in a first lane; using the second strobe signal at a second peripheral device to sample the clock signal to generate a second output signal in a second lane; determining if the first peripheral device is coupled to the main device through the first lane based on the first output signal; and determining if the second peripheral device is coupled to the main device through the second lane based on the second output signal.

In Example 12, the method of Example 11 may optionally further comprise: generating a third strobe signal from the main device; using the third strobe signal at a third peripheral device to sample the clock signal to generate a third output signal in a third lane; and determining if the third peripheral device is coupled to the main device through the third lane based on the third output signal.

In Example 13, the method of any one of Examples 11-12 may optionally further include, wherein determining if the first peripheral device is coupled to the main device comprises determining if the first output signal contains a first predefined pattern using a write leveling algorithm, and wherein determining if the second peripheral device is coupled to the main device comprises determining if the second output signal contains a second predefined pattern using the write leveling algorithm.

In Example 14, the method of any one of Examples 11-13 may optionally further include, wherein using the first strobe signal at the first peripheral device further comprises using the first strobe signal at the first peripheral device in at least two iterations to generate the first output signal and a third output signal in the first lane by sampling the clock signal, and wherein using the second strobe signal at the second peripheral device further comprises using the second strobe signal at the second peripheral device in at least two iterations to generate the second output signal and a fourth output signal in the second lane by sampling the clock signal.

In Example 15, the method of Example 14 may optionally further include, wherein generating the first and second strobe signals comprises adjusting a delay of the first strobe signal relative to the clock signal based on the first and third output signals, and adjusting a delay of the second strobe signal relative to the clock signal based on the second and fourth output signals.

In Example 16, the method of Example 14 may optionally further include, wherein determining if the first peripheral device is coupled to the main device further comprises determining if the first peripheral device is coupled to the main device through the first lane based on the first and third output signals, and wherein determining if the second peripheral device is coupled to the main device further comprises determining if the second peripheral device is coupled to the main device through the second lane based on the second and fourth output signals.

In Example 17, the method of Example 14 may optionally further comprise: determining if a variation of values indicated by the first and third output signals are within a predefined range to reduce effects of clock jitter; and determining if a variation of values indicated by the second and fourth output signals are within the predefined range to reduce the effects of clock jitter.

In Example 18, the method of any one of Examples 11-17 may optionally further comprise: detecting a range of attributes of the first peripheral device using the first strobe signal; and detecting a range of attributes of the second peripheral device using the second strobe signal.

Example 19 is a non-transitory computer-readable storage medium comprising instructions stored thereon for causing an electronic circuit system to detect lanes coupled to peripheral devices, wherein the instructions comprise: instructions executable to generate first and second strobe signals and a clock signal using a main device in the electronic circuit system; instructions executable to use the first strobe signal at a first peripheral device to generate a first output signal in a first lane in response to the clock signal; instructions executable to use the second strobe signal at a second peripheral device to generate a second output signal in a second lane in response to the clock signal; instructions executable to determine if the first peripheral device is coupled to the main device through the first lane based on the first output signal; and instructions executable to determine if the second peripheral device is coupled to the main device through the second lane based on the second output signal.

In Example 20, the non-transitory computer-readable storage medium of Example 19 may optionally further include, wherein the instructions further comprise: instructions executable to generate a third strobe signal from the main device; instructions executable to use the third strobe signal at a third peripheral device to generate a third output signal in a third lane in response to the clock signal; and instructions executable to determine if the third peripheral device is coupled to the main device through the third lane based on the third output signal.

In Example 21, the non-transitory computer-readable storage medium of any one of Examples 19-20 may optionally further include, wherein the instructions executable to use the first strobe signal at the first peripheral device further comprise instructions executable to use the first strobe signal at the first peripheral device in at least two iterations to generate the first output signal and a third output signal in the first lane in response to the clock signal, and wherein the instructions executable to use the second strobe signal at the second peripheral device further comprise instructions executable to use the second strobe signal at the second peripheral device in at least two iterations to generate the second output signal and a fourth output signal in the second lane in response to the clock signal.

In Example 22, the non-transitory computer-readable storage medium of Example 21 may optionally further include, wherein the instructions executable to determine if the first peripheral device is coupled to the main device through the first lane further comprise instructions executable to determine if the first peripheral device is coupled to the main device through the first lane based on the first and third output signals, and wherein the instructions executable to determine if the second peripheral device is coupled to the main device through the second lane further comprise instructions executable to determine if the second peripheral device is coupled to the main device through the second lane based on the second and fourth output signals.

The foregoing description of the exemplary embodiments has been presented for the purpose of illustration. The foregoing description is not intended to be exhaustive or to be limiting to the examples disclosed herein. The foregoing is merely illustrative of the principles of this disclosure and various modifications can be made by those skilled in the art. The foregoing embodiments may be implemented individually or in any combination.

What is claimed is:

1. An electronic circuit system comprising:
   a main device that generates first and second strobe signals and a clock signal, wherein the main device comprises a processing integrated circuit;
   peripheral devices, wherein each of the peripheral devices comprises a memory integrated circuit; and
   lanes, wherein a first one of the peripheral devices uses the first strobe signal with the clock signal to generate a first output signal in a first lane one of the lanes;
   wherein a second one of the peripheral devices uses the second strobe signal with the clock signal to generate a second output signal in a second one of the lanes,
   wherein the main device determines if the first one of the peripheral devices is coupled to the main device through the first one of the lanes based on the first output signal, wherein the main device determines if the second one of the peripheral devices is coupled to the main device through the second one of the lanes based on the second output signal, and wherein the main device detects a number of the lanes that are coupled to the peripheral devices and that are active in the electronic circuit system.

2. The electronic circuit system of claim 1,
wherein a third one of the peripheral devices uses a third strobe signal with the clock signal to generate a third output signal in a third one of the lanes,
wherein the main device generates the third strobe signal, and wherein the main device determines if the third one of the peripheral devices is coupled to the main device through the third one of the lanes based on the third output signal.

3. The electronic circuit system of claim 1, wherein the main device determines if the first one of the lanes has a faulty connection between the first one of the peripheral devices and the main device based on the first output signal containing a first predefined pattern according to a write leveling algorithm, and wherein the main device determines if the second one of the lanes has a faulty connection between the second one of the peripheral devices and the main device based on the second output signal containing a second predefined pattern according to the write leveling algorithm.

4. The electronic circuit system of claim 1, wherein the main device adjusts a delay of the first strobe signal relative to the clock signal based on the first output signal to generate a first adjusted strobe signal, and wherein the main device adjusts a delay of the second strobe signal relative to the clock signal based on the second output signal to generate a second adjusted strobe signal.

5. The electronic circuit system of claim 4, wherein the first one of the peripheral devices uses the first adjusted strobe signal with the clock signal to generate a third output signal in the first one of the lanes, and wherein the second one of the peripheral devices uses the second adjusted strobe signal with the clock signal to generate a fourth output signal in the second one of the lanes.

6. The electronic circuit system of claim 5, wherein the main device determines if the first one of the peripheral devices is coupled to the main device through the first one of the lanes without a fault based on the first and the third output signals, and wherein the main device determines if the second one of the peripheral devices is coupled to the main device through the second one of the lanes without a fault based on the second and the fourth output signals.

7. The electronic circuit system of claim 5, wherein the range electronic circuit system powers down the lanes and the peripheral devices determined to be inactive.

8. The electronic circuit system of claim 1, wherein the main device adjusts a delay of the first strobe signal to the first one of the peripheral devices relative to the clock signal to align an edge of the first strobe signal with an edge of the clock signal, and wherein the main device adjusts a delay of the second strobe signal to the second one of the peripheral devices relative to the clock signal to align an edge of the second strobe signal to an edge of the clock signal.

9. The electronic circuit system of claim 1, wherein the main device selects a value of the first output signal that occurs most frequently from the first one of the peripheral devices in the first one of the lanes as a final trained value for the first one of the peripheral devices, wherein the main device selects a value of the second output signal that occurs most frequently from the second one of the peripheral devices in the second one of the lanes as a final trained value for the second one of the peripheral devices, and wherein the main device uses the final trained values for the first and the second ones of the peripheral devices to adjust the first and the second strobe signals, respectively.

10. The electronic circuit system of claim 1, wherein the main device collects errors in the first and the second output signals and determines if the errors in the first and the second output signals have values that are within predefined ranges.

11. A method for detecting lanes coupled to peripheral devices in an electronic circuit system, the method comprising:
generating first and second strobe signals and a clock signal from a main device;
using the first strobe signal at a first one of the peripheral devices to sample the clock signal to generate a first output signal in a first one of the lanes;
using the second strobe signal at a second one of the peripheral devices to sample the clock signal to generate a second output signal in a second one of the lanes; and
detecting a number of the lanes that are coupled to the peripheral devices and that are active in the electronic circuit system using the main device by determining whether the first one of the peripheral devices is coupled to the main device through the first one of the lanes based on the first output signal and determining whether the second one of the peripheral devices is coupled to the main device through the second one of the lanes based on the second output signal.

12. The method of claim 11 further comprising:
generating a third strobe signal from the main device;
using the third strobe signal at a third one of the peripheral devices to sample the clock signal to generate a third output signal in a third one of the lanes; and
determining whether the third one of the peripheral devices is coupled to the main device through the third one of the lanes based on the third output signal.

13. The method of claim 11, wherein determining whether the first one of the peripheral devices is coupled to the main device comprises determining whether the first output signal contains a first predefined pattern using a write leveling algorithm, and
wherein determining whether the second one of the peripheral devices is coupled to the main device comprises determining whether the second output signal contains a second predefined pattern using the write leveling algorithm.

14. The method of claim 11, wherein using the first strobe signal at the first one of the peripheral devices further comprises using the first strobe signal at the first one of the peripheral devices in at least two iterations to generate the first output signal and a third output signal in the first one of the lanes by sampling the clock signal, and
wherein using the second strobe signal at the second one of the peripheral devices further comprises using the second strobe signal at the second one of the peripheral devices in at least two iterations to generate the second output signal and a fourth output signal in the second one of the lanes by sampling the clock signal.

15. The method of claim 14, wherein generating the first and the second strobe signals comprises adjusting a delay of the first strobe signal relative to the clock signal based on the first and the third output signals, and adjusting a delay of the second strobe signal relative to the clock signal based on the second and the fourth output signals.

16. The method of claim 14, wherein determining whether the first one of the peripheral devices is coupled to the main device further comprises determining whether the first one of the peripheral devices is coupled to the main device through the first one of the lanes based on the first and the third output signals, and wherein determining whether the second one of the peripheral devices is coupled to the main device further comprises determining whether the second one of the peripheral devices is coupled to the main device through the second one of the lanes based on the second and the fourth output signals.

17. The method of claim 14 further comprising:
determining if a variation of values indicated by the first and the third output signals are within a predefined range to reduce effects of clock jitter; and
determining if a variation of values indicated by the second and the fourth output signals are within the predefined range to reduce the effects of clock jitter.

18. The method of claim 11 further comprising:
detecting a range of attributes of the first one of the peripheral devices using the first strobe signal; and
detecting the range of the attributes of the second one of the peripheral devices using the second strobe signal.

19. A non-transitory computer-readable storage medium comprising instructions stored thereon for causing an electronic circuit system to detect lanes coupled to peripheral devices, wherein the instructions comprise:
instructions executable to generate first and second strobe signals and a clock signal using a main device in the electronic circuit system;
instructions executable to use the first strobe signal at a first one of the peripheral devices to generate a first output signal in a first one of the lanes in response to the clock signal;
instructions executable to use the second strobe signal at a second one of the peripheral devices to generate a second output signal in a second one of the lanes in response to the clock signal; and
instructions executable to detect a number of the lanes that are coupled to the peripheral devices and that are active in the electronic circuit system using the main device by determining whether the first one of the peripheral devices is coupled to the main device through the first one of the lanes based on the first output signal and by determining whether the second one of the peripheral devices is coupled to the main device through the second one of the lanes based on the second output signal.

20. The non-transitory computer-readable storage medium of claim 19, wherein the instructions further comprise:
instructions executable to generate a third strobe signal from the main device; and
instructions executable to use the third strobe signal at a third one of the peripheral devices to generate a third output signal in a third one of the lanes in response to the clock signal,
wherein the instructions executable to detect the number of the lanes that are coupled to the peripheral devices and that are active in the electronic circuit system further comprise determining whether the third one of the peripheral devices is coupled to the main device through the third one of the lanes based on the third output signal.

21. The non-transitory computer-readable storage medium of claim 19, wherein the instructions executable to use the first strobe signal at the first one of the peripheral devices further comprise instructions executable to use the first strobe signal at the first one of the peripheral devices in at least two iterations to generate the first output signal and a third output signal in the first one of the lanes in response to the clock signal, and
wherein the instructions executable to use the second strobe signal at the second one of the peripheral devices further comprise instructions executable to use the second strobe signal at the second one of the peripheral devices in at least two iterations to generate the second output signal and a fourth output signal in the second one of the lanes in response to the clock signal.

22. The non-transitory computer-readable storage medium of claim 21, wherein the instructions executable to detect the number of the lanes that are coupled to the peripheral devices and that are active in the electronic circuit system using the main device further comprise instructions executable to determine whether the first one of the peripheral devices is coupled to the main device through the first one of the lanes based on the first and the third output signals, and
instructions executable to determine whether the second one of the peripheral devices is coupled to the main device through the second one of the lanes based on the second and the fourth output signals.

* * * * *